United States Patent
Lasser (10) Patent No.: US 7,224,604 B2
(45) Date of Patent: May 29, 2007

(54) METHOD OF ACHIEVING WEAR LEVELING IN FLASH MEMORY USING RELATIVE GRADES

(75) Inventor: Menahem Lasser, Kohav Yair (IL)

(73) Assignee: SanDisk IL Ltd., Kfar Saba (IL)

( * ) Notice: Subject to any disclaimer, the term of this patent is extended or adjusted under 35 U.S.C. 154(b) by 0 days.

(21) Appl. No.: 11/288,161

(22) Filed: Nov. 29, 2005

(65) Prior Publication Data

US 2006/0203546 A1 Sep. 14, 2006

Related U.S. Application Data

(60) Provisional application No. 60/661,256, filed on Mar. 14, 2005.

(51) Int. Cl.
*G11C 16/06* (2006.01)
(52) U.S. Cl. .................. 365/185.09; 711/103; 711/156
(58) Field of Classification Search ........... 365/185.09; 711/103, 156
See application file for complete search history.

(56) References Cited

U.S. PATENT DOCUMENTS

| | | | |
|---|---|---|---|
| 5,341,339 A | 8/1994 | Wells | |
| 5,388,083 A | 2/1995 | Assar | |
| 5,404,485 A | 4/1995 | Ban | |
| 5,568,423 A | 10/1996 | Jou | |
| 5,712,819 A | 1/1998 | Harari | |
| 5,963,480 A | 10/1999 | Harari | |
| 6,230,233 B1 | 5/2001 | Lofgren | |
| 6,570,790 B1 | 5/2003 | Harari | |
| 6,732,221 B2 | 5/2004 | Ban | |
| 6,831,865 B2 | 12/2004 | Chang | |
| 7,032,087 B1 * | 4/2006 | Chang et al. | 711/156 |

* cited by examiner

*Primary Examiner*—VanThu Nguyen
(74) *Attorney, Agent, or Firm*—Mark M. Friedman (57) ABSTRACT

For each block of a memory, a number is calculated that is a function of how many times the block has been erased and of how many times at least one other block has been erased. The numbers are stored in the memory device that includes the memory. The numbers are updated as needed when blocks are erased. Blocks are selected to be erased in accordance with their numbers. Preferably, each block's function is the block's relative grade.

21 Claims, 5 Drawing Sheets

METHOD OF ACHIEVING WEAR LEVELING IN FLASH MEMORY USING RELATIVE GRADES

This patent application claims the benefit of U.S. Provisional Patent Application No. 60/661,256, filed Mar. 14, 2005

FIELD AND BACKGROUND OF THE INVENTION

The present invention relates to flash memories and, more particularly, to a method of extending flash memory useful life by achieving wear leveling of the blocks in the memory.

Flash memory devices have been known for many years. Flash devices are used for manufacturing highly reliable solid-state disks, for data storage in PDAs and cellular phones, for audio files storage in MP3 players and for many other applications. One of the aspects that must be considered when designing a product using flash memory for data storage is that the number of times a flash block may be erased and re-written is limited. For example currently commercially-available NAND flash devices are typically specified by their manufacturers to support up to 100,000 cycles of write/erase per block, while the more dense Multi-Level-Cell (MLC) NAND flash devices storing two bits per cell are typically specified to support up to 10,000 cycles of write/erase per block. After a block reaches its specified write/erase cycles limit, it is no longer guaranteed by the device manufacturer to operate according to its specifications. Therefore, care must be taken to avoid a condition in which blocks of the memory unnecessarily reach this limit.

Because different flash memory vendors use different terminologies in describing the units of storage, we define here that for the purpose of the present disclosure a "block" is the smallest unit of storage that can be erased in a single operation, while a "page" is the smallest unit of storage that can be written (or "programmed") in a single operation.

If no measures are taken to avoid non-even wear, the normal operation of a memory system might lead to such non-even wear across the population of blocks. This is because most software systems tend to write in a non-uniform manner across their storage address space. This is even more so when a file system such as Microsoft FAT is maintained in the storage system. In such cases some management data is typically kept by the file system at the beginning of the storage system address space. These data may be one or more copies of file allocation tables or the root directory of the storage volume. The frequency of writing to these management data areas is much higher than to other storage areas, and therefore, unless special measures are taken, the blocks containing them experience much higher numbers of write/erase cycles and reach their end of life sooner than other blocks. We then have a storage volume in which most blocks are still very far from their end-of-life limit but the volume as a whole already has reached its end-of-life because a few critical blocks already have reached that condition.

It is clear from the above that we should try to equalize the number of write/erase cycles across the blocks of the device. If all blocks have approximately similar write/erase histories, the life of the storage system as a whole is maximized.

The prior art teaches many solutions for solving the above flash memory wear-leveling problem. A few examples are:
U.S. Pat. No. 6,230,233 to Lofgren et al.
U.S. Pat. No. 5,341,339 to Wells
U.S. Pat. No. 5,568,423 to Jou et al.
U.S. Pat. No. 5,388,083 to Assar et al.
U.S. Pat. No. 5,712,819 to Harari
U.S. Pat. No. 6,570,790 to Harari
U.S. Pat. No. 5,963,480 to Harari
U.S. Pat. No. 6,831,865 to Chang et al.

All of the above patents are incorporated by reference for all purposes as if fully set forth herein.

What is common to all the above prior art is that it all is based on counting the number of erase cycles experienced by each block. For the purpose of the present disclosure an "erase count" is a number that represents the number of times a block of flash memory has been erased throughout its history of use. The erase counts are stored within the storage system and maintained during system operation. Whenever a block is erased, its erase count is incremented. Some of the above solutions store the erase count of a block within the block. Some store all erase counts of all blocks in a centralized table in a specially allocated location within the flash memory. Still others store the erase counts in the RAM of the controller managing the flash memory, in addition to storing the erase counts in non-volatile memory. But in all cases the number of erase cycles executed by a block is known and used for achieving the wear leveling goal. By looking at the erase counts of the blocks the flash management software can detect which blocks have been used the most and which blocks have been used the least.

There are two main levels in how this knowledge of the erase counts is put into use for achieving wear leveling. The simplest level is activated when a new block is needed to be allocated for use and the flash management system has to decide which one of the free blocks available for use should be the one allocated. Typically the decision algorithm prefers a block with a low number of erase cycles over another block with a high number of erase cycles, so that the spread of the counts will be smaller and the wear of the blocks will be more uniform. This level of wear leveling is herein called "dynamic wear leveling". The more advanced level takes into account the fact that some files are static in nature and are typically written once and almost never updated or rewritten. This is the case with most operating system code files or software applications such as word processing programs. Without taking special measures, the wear leveling done by dynamic wear leveling algorithms does not affect the blocks used by static files, because those blocks never become free in the regular course of system operation. This leaves those blocks with very low erase counts and in practice means that the lifetime of the memory system is lower than it could have been. Therefore advanced wear leveling solutions handle this problem by occasionally forcing static files to move to other blocks even though these files are not rewritten. This allows blocks of static files to re-enter the pool of frequently allocated blocks that take part in allocations, and thus improves the overall leveling of the erase counts and consequently the lifetime of the storage system. This level of wear leveling is herein called "static wear leveling". The term "wear leveling" with no additional qualification applies to both dynamic and static wear leveling.

The above prior art references disclose many algorithms that achieve the desired result of wear leveling, but all these algorithms rely on knowing the erase counts of the blocks.

An exception to this general rule is U.S. Pat. No. 6,732,221 to Ban. Ban discloses a method for achieving wear leveling in flash memory that does not rely on counting erase cycles per block. Instead Ban uses statistical methods to select the blocks to allocate and use, so that in the long run, after the system goes through many cycles of erasing blocks, the wear of all blocks is close to uniform with a high probability. However, Ban does not guarantee that the uniformity of wear leveling is achieved in the short term, after only a relatively low number of erase cycles. Therefore Ban's solution does not operate well for flash devices with a very low limit of write/erase cycles, such as 1,000.

In all the prior art solutions that rely on counting erase cycles per block, there is a need to store the count of each block. Whether the count is kept within the same block to which it applies or in any other location, storage must be allocated for the count. For a 100,000 cycles flash device at least 17 bits are needed per count, and for a 10,000 flash device at least 14 bits are needed per count. In some cases this is too much space to reserve for that purpose. For example, assume a flash management system for managing NAND flash devices such that each page of 512 bytes of user data are accompanied by 16 bytes of "extra area" for storing control information of the system. Because an erase count is an attribute of a full block and not of a single page, typically such an erase count is stored in only one of the pages of a block, typically in the first page. So at least three bytes (assuming a 100,000 cycles device) of the extra area of the first page should be allocated to storing the erase count of the block. But these extra area bytes might be needed for storing other management information required by the flash management software for efficient management, or for parity bits of an error correction scheme for the data stored in the page.

Similarly, if the erase counts are kept in a central table, the amount of space required might be too high. If a flash disk contains four 1 Gbit flash devices, each having 4,096 blocks of 32Kbytes, and each requiring an erase count of three bytes, then the size of the table is 4×4,096×3=49,152 bytes. This is more than the size of a block, even before including multiple copies for backup. More importantly, it is useful for performance reasons to keep a copy of the erase counts table in RAM, but the above amount is too large, typically beyond the amount of available RAM in flash controllers.

There is thus a widely recognized need for, and it would be highly advantageous to have, a method for achieving wear leveling of flash memory blocks that on the one hand provides uniform erase cycles across the blocks population while on the other hand consumes less memory than the prior art methods that count the erase cycles and store their number.

SUMMARY OF THE INVENTION

According to the present invention there is provided a method of managing a memory, of a memory device, that includes a plurality of blocks, the method including the steps of, for each block: (a) calculating a number that is a function of how many times the each block has been erased and of how many times at least one other block has been erased; and (b) storing the number in the memory device.

According to the present invention there is provided a memory device including: (a) a memory that includes a plurality of blocks; and (b) a controller for managing the memory by steps including, for each block: (i) calculating a number that is a function of how many times the each block has been erased and of how many times at least one other block has been erased, and (ii) storing the number in the memory device.

According to the present invention there is provided a computer-readable storage medium having computer-readable code embodied on the computer-readable storage medium, the computer-readable code for managing a memory, of a memory device, that includes a plurality of blocks, the computer-readable code including: (a) program code for, for each block, calculating a number that is a function of how many times the each block has been erased and of how many times at least one other block has been erased; and (b) program code for, for each block, storing the number in the memory device.

According to the basic method of the present invention, the management of the blocks of a memory of a memory device includes, for each block, calculating a number that is a function of how many times the block has been erased and of how many times one or more other blocks have been erased, and storing the numbers in the memory device. Preferably, each block's number is updated whenever the block is erased and whenever one of the other blocks, whose erase count is an argument of the function, is erased.

Preferably, the method includes the step of selecting at least one block to erase at least in part in accordance with the numbers, Each block's number may be stored either in the block itself or outside the block.

Preferably, for each block, the function is a relative grade of the block. As understood herein, a block's "relative grade" is a measure of how many times the block has been erased, relative to how many times at least one other block has been erased. As will be seen below, in general it is not necessary to explicitly count the number of times the blocks are erased in order to compute their relative grades.

In one preferred embodiment of the present invention, the specific "relative grade" that is used is such that, for at least one of the blocks, that block's relative grade depends on the difference between that block's erase count and the erase count of another block. Most preferably, the other block is a neighbor of the target block.

In another preferred embodiment of the present invention, the specific "relative grade" that is used is such that, for at least one of the-blocks, that block's relative grade depends on the difference between that block's erase count and the average erase count of at least two other blocks. Most preferably, at least one of the other blocks is a neighbor of the target block.

Preferably, calculating the numbers includes truncating each block's function at a number of bits that is insufficient to store the expected maximum number of erase cycles per block.

The scope of the present invention also includes a memory device that is managed according to the method of the present invention and a computer-readable storage medium having embodied thereon computer-readable code for managing a memory according to the method of the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of achieving wear leveling in a memory such as a flash memory without explicitly counting erase cycles.

The principles and operation of wear leveling according to the present invention may be better understood with reference to the drawings and the accompanying description.

The present invention is based on the observation that in order to equalize the erase cycles of the blocks it is not really necessary to know the exact number of erase cycles of each block. Because equality of erase cycles is really a matter of the relation between the number of cycles of different blocks, it is possible to achieve that goal by measures that rely on keeping only relations between numbers of cycles of different blocks, rather than on keeping the absolute values of numbers of cycles.

An example of such a method is, for each block keeping a value equal to the difference between the number of times the block has been erased and the average number of times its two closest neighboring blocks have been erased. In the present context, "neighbors" are defined by block addresses. For example, if blocks are numbered consecutively, the "neighbors" of block 10 are blocks 9 and 11. Or in a more formal notation—the number associated with block n is $EC(n)-(EC(n-1)+EC(n+1))/2$, where $EC(i)$ is the erase count of block i. As fractions are not convenient to handle, we slightly modify the definition of the value to be twice the above expression, so that in the following explanations the value is equal to $2EC(n)-EC(n-1)-EC(n+1)$.

This value is a simple instance of what is termed herein the "relative grade" of the block. In order to make the above definition of a relative grade to be also applicable to the first and last blocks, the first and last blocks are defined to be neighbors of each other such that all blocks are considered to be cyclically ordered with the first block following the last block. So the relative grade of the first block (assuming the blocks are numbered from zero to N−1) is $2EC(0)-EC(N-1)-EC(1)$, and the relative grade of the last block is $2EC(N-1)-EC(N-2)-EC(0)$.

What is stored for each block is not the erase count of the block but the relative grade of the block. It should be noted that even though the relative grades are uniquely determined by the erase counts, the erase counts are not uniquely determined by the relative grades. This can be easily verified by considering the simple case in which all blocks have been erased exactly the same number of times. In such a case all blocks have a relative grade of zero. But knowing the relative grades of all blocks does not allow us to reconstruct the erase counts. It may be that all blocks have passed through 10 erase cycles or it may be that all blocks have passed through 1,000 erase cycles. For any integer N, the case of all blocks passing through N erase cycles results in exactly the same relative grades: a relative grade of zero for all blocks.

It thus is clear that the concept of a relative grade is fundamentally different from the concept of an erase count. An erase count of a block is a characteristic of that individual block, whereas a relative grade of a block is not a characteristic of that individual block but rather a measure of that block's relative condition compared to other blocks. The relative grade of a block contains no absolute information about the condition of the block on its own. This distinguishes the relative grade approach from the prior art solutions that use erase counts as the basis for achieving wear leveling, and also from the generalized solution of Harari, U.S. Pat. No. 5,712,819, that uses "a characteristic of a block" as a generalization of an erase count.

The concept of relative grade is fundamentally different from storing, for each block, some function of the block's erase count such as twice the erase count or the square of the erase count. While the square of the erase count is certainly different from the erase count, it still falls within the scope of "a characteristics of the block" because it depends solely on the condition of the block. It should be noted that the critical feature of the relative grade that makes the relative grade different from a characteristic of the block is not that the erase counts cannot be reconstructed from the relative grades, but that the relative grade of a block is not uniquely determined by the erase count of just that same block. For example, if we store for each block the remainder of its erase count when divided by some integer M, this value is still a characteristic of the block even though it is impossible to reconstruct the erase count from that remainder, because the remainder is uniquely determined by the erase count of that block.

One advantage of storing relative grades rather than erase counts is the saving in storage space. If the wear leveling works properly and achieves its goal of approximately equalizing the number of erase cycles over the population of blocks, then the absolute values of the relative grades are small. This means we can use fewer bits per block and the overall storage devoted, either in nonvolatile or volatile memory, to the purpose of wear leveling is smaller than in prior art solutions. For example, we may allocate just 8 bits of storage per block, even if the maximum number of erase cycles allowed for a block is 100,000. This is less than half of the amount of storage used in prior art systems that store erase counts. It should be noted that unlike erase counts, that are always positive integers, relative grades may be either positive or negative. Therefore when using 8 bits per relative grade the range of values that can be represented is between −128 and +127, assuming the use of the "two's complement" method for representing negative numbers.

Figure 1:
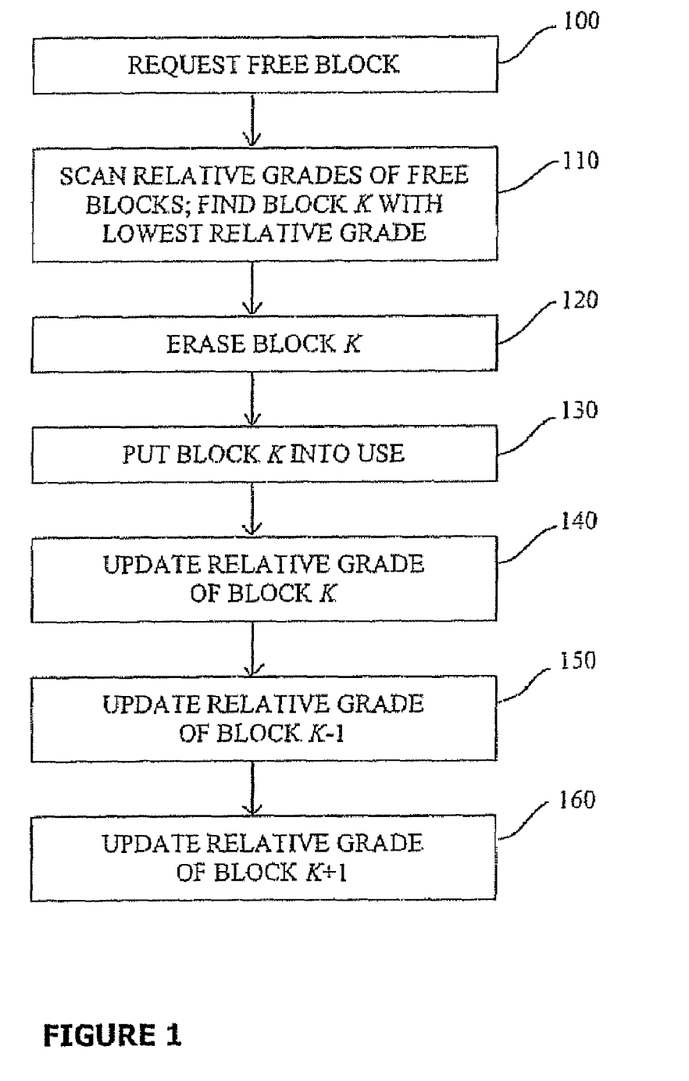
FIG. 1 is a flow chart of how a free block is allocated for use according to the present invention.

Given the relative grades for all blocks, these relative grades are used in place of the erase counts for achieving the wear leveling of the blocks. Each of the wear leveling algorithms disclosed in the prior art that uses erase counts is easily adapted to use relative grades instead of erase counts. Referring now to the drawings, FIG. 1 shows an example of how this is achieved. FIG. 1 is a flow chart of the steps taken when a free block has to be allocated for use (that is, for doing dynamic wear leveling). In step 100 a request is received from the flash management system for allocating a free block for use. In step 110 the relative grades of all free blocks are scanned to find the free block with the lowest relative grade. If more than one free block has the same lowest value, one of those blocks is arbitrarily selected. In step 120 that selected block (henceforth "block K") is erased. This assumes that the flash management system keeps its pool of free blocks in an un-erased state. Some flash management systems keep their pool of free blocks in an already erased state, for speeding up the process of putting a free block into use. It will be easy for any person with ordinary skill in the art to modify this method of wear leveling for working within such systems. In step 130 block K is put into use. The details of how this is done and which control fields are updated as a result differ between different flash management systems, and are not relevant to understanding the methods of the present invention.

In step 140 the relative grade of block K is updated to reflect the fact that block K has just passed through one more erase cycle. This is further elaborated on in FIG. 2.

In step 150 the relative grade of block K−1 is updated to reflect the fact that block K has just passed through one more erase cycle. This is further elaborated on in FIG. 3.

In step 160 the relative grade of block K+1 is updated to reflect the fact that block K has just passed through one more erase cycle. This, too, is further elaborated on in FIG. 3.

Figure 2:
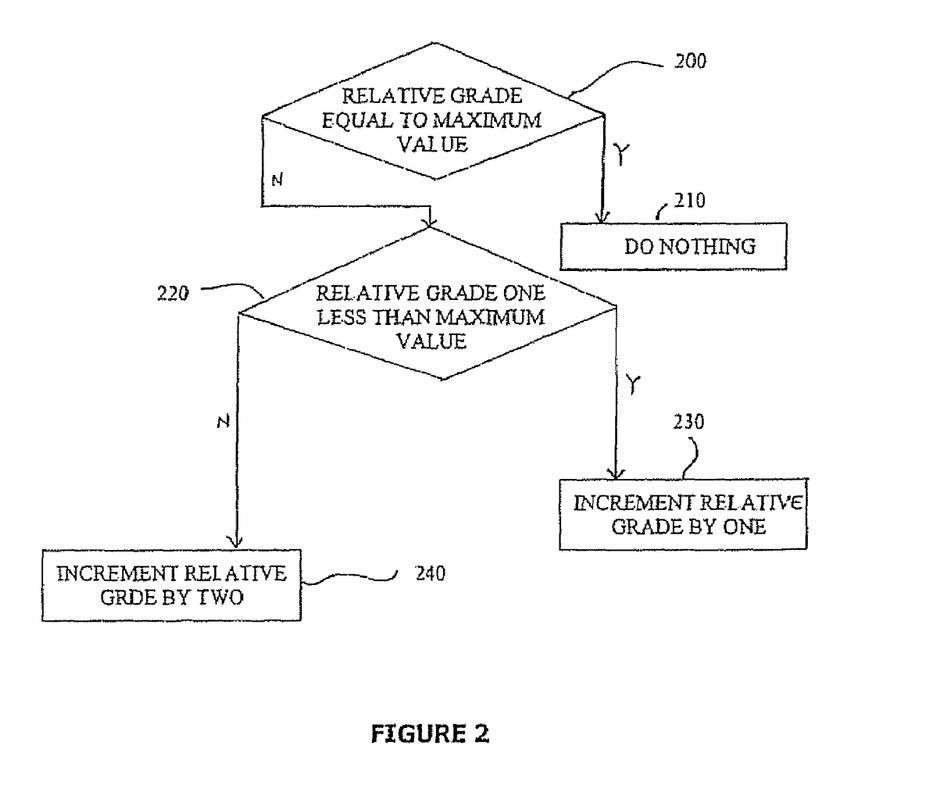
FIG. 2 is a flow chart of how the relative grade of the block of FIG. 1 is updated.

FIG. 2 elaborates on how the relative grade of block K is updated (step 140 of FIG. 1). In step 200 we check if the relative grade of block K is equal to the maximum value that can be stored. For the example above of relative grades using 8 bits, this means asking if the relative grade is equal to 127. If the answer is positive, we cannot further increment the relative grade and we do nothing (step 210). If the answer is negative, there is room for incrementing the relative grade and then we further check (step 220) if the relative grade of block K is equal to the maximum value that can be stored minus one. For the example above of relative grades using 8 bits, this means asking if the relative grade is equal to 126. If the answer is positive, then in step 230 we increment the relative grade by one. If the answer is negative, then in step 240 we increment the relative grade by two. The end result of this logic is that the relative grade is incremented by two, unless there is no room for such increment, in which case the relative grade is truncated at the maximum possible value. This result is in line with the definition of the relative grade that is twice the difference between the number of erase cycles of a block and the average number of erase cycles of its two neighbors. Letting the block go through one additional erase cycle (while the two neighbors do not go through additional erase cycles at this stage) clearly results in the relative grade going up by two.

Figure 3:
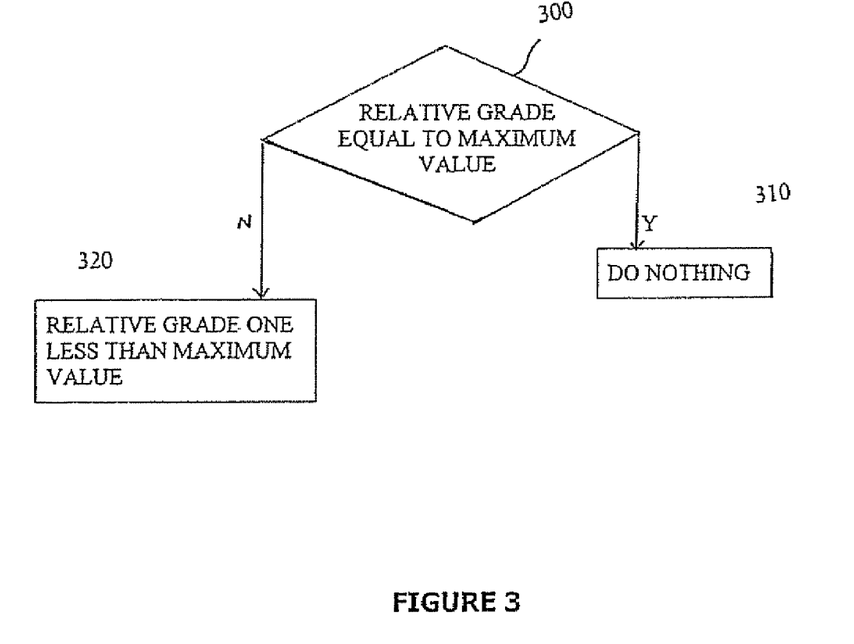
FIG. 3 is a flow chart of how the relative grades of the neighbors of the block of FIG. 1 are updated.

FIG. 3 elaborates on how the relative grades of blocks K−1 and K+1 are updated (steps 150 and 160, respectively, of FIG. 1). In step 300 we check if the relative grade of block K−1 or block K+1 is equal to the minimum value that can be stored. For the example above of relative grades using 8 bits, this means asking if the relative grade is equal to −128. If the answer is positive, we cannot further decrement the relative grade and we do nothing (step 310). If the answer is negative, there is room for decrementing the relative grade and then in step 320 we decrement the relative grade by one. The end result of this logic is that the relative grade is decremented by one, unless there is no room for such decrement, in which case the relative grade is truncated at the minimum possible value. This result is again in line with the definition of the relative grade that is twice the difference between the number of erase cycles of a block and the average number of erase cycles of its two neighbors. Letting one neighboring block go through one additional cycle (while neither that block nor the other neighbor goes through an additional erase cycle at this stage) clearly results in the relative grade going down by one.

The fact that it is possible for a relative grade value to be truncated at the minimum or maximum values means the kept values of the relative grades may be just an approximation of the theoretically true values. However, because the use of the relative grades for achieving wear leveling results in the relative grades typically being small and close to zero, this approximation is quite accurate for most blocks. The wear leveling algorithms are typically not sensitive to small deviations from the accurate counts of erase cycles and therefore it is justified to save in storage area by using a smaller number of bits for storing the relative grades in exchange for some inaccuracies and approximations of the values.

The above explanation dealt with achieving dynamic wear leveling based on the relative grades. The relative grades also can be used for the purpose of static wear leveling. For achieving this, from time to time the relative grades of all used blocks are scanned, looking for blocks with very low relative grades. Finding a block with such low relative grade means that block was cycled much less than its neighbors. The flash management system then takes care to copy the contents of that block to another block that is allocated for replacing it and then brings that block back into the free blocks pool. This eventually results in equalizing the number of erase cycles of that block compared to the other blocks, as desired. The scanning for blocks with very low relative grades can either be triggered periodically once every certain interval of time, or incorporated into the dynamic wear leveling mechanism so that static blocks are only brought back into the free pool when some user-initiated write operation is taking place. Both methods are taught in the prior art for implementing static wear leveling.

It should be understood that using relative grades as the basis for wear leveling is an approximation that might not result in the most optimal leveling. This is because a relative grade provides only local information on the amount of usage of a block compared to the block's neighbors. It does not provide global information applying to the full device. It might happen that one block has a relative grade higher than the relative grade of a second block, but in reality the second block has passed through more erase cycles than the first block. Still, on average and over long periods of operation time, relying on relative grades provides close to optimal wear leveling.

The methods of the present invention, that use relative grades rather than erase counts, are especially useful for systems that store the grades of all blocks together in a central location. This is so because the cost of updating the relative grades of three neighboring blocks or of one block is practically the same. This is not so in systems that store the grade of each block within that block, because in this case updating the relative grades of three blocks means writing into three blocks, and this is three time as costly in time as updating a single block. However, the methods of the present invention are applicable even in this case of separate storage of the relative grades, even if they are less efficient than in the central storage case.

The formula presented above for calculating the relative grade of a block, as two times the difference between the number of erase cycles of that block and the average number of erase cycles of its two neighbors, is not the only way of calculating relative grades. For example, one can define a relative grade that represents the difference between the number of erase cycles of the block and the average number of erase cycles of its four nearest neighbors, two on each side. More generally, for every even number N we may calculate relative grades that represent the difference between the number of erase cycles of the block and the average number of erase cycles of its N nearest neighbors, N/2 blocks on each side. The advantage of the two-blocks-neighborhood calculation presented above is that it requires updating the relative grades of just three blocks on each block erase operation, while in the general case of N-blocks-neighborhood calculation, the relative grades of N+1 blocks have to be updated on each block erase operation. This minimization of the number of relative grades to update is especially important when the relative grades are each stored separately within its block, as this requires more blocks to be written and writing into flash memory is a relatively slow operation. On the other hand, using N>2 makes the present invention less sensitive to local fluctuations.

The calculation of a relative grade can be further approximated and simplified by employing a relative grade that is not symmetrically centered around the block. For example, the relative grade may be defined to represent the difference between the number of erase cycles of the block and the number of erase cycles of one its neighboring blocks, say the one preceding it. So the relative grade of block i is equal to EC(i)–EC(i–1), and the relative grade of block 0 is EC(0)–EC(N–1) where N is the number of blocks. This one-sided definition provides a cruder approximation of the relative non-evenness of the numbers of erase cycles of the blocks than the symmetrical definitions discussed above, but it still provides good enough wear leveling in the long run. An advantage of this simplified definition of relative grades is that only two relative grades have to be updated per each block erase operation.

Furthermore, it is not even necessary that the other blocks used in calculating the relative grade of a given block really be adjacent neighbors. Any other blocks will do, as long as we take care to keep the calculations consistent across all blocks. For example, we may use a definition in which the relative grade of block i is equal to 2EC(i)–EC(i+30)–EC(i+70). In order to make the calculation meaningful for all blocks, we consider the first block to be the follower of the last block. This definition of relative grade is similar to the first definition presented above, the difference being that offsets of (+30) and (+70) are used instead of offsets of (–1) and (+1). Wear leveling algorithm based on these two definitions of relative grades are expected to perform at the same level on average.

As a result of all the above we see that the methods of the present invention provide an efficient way for achieving wear leveling of the blocks of a flash memory based storage system. The scope of the present invention includes the methods presented above, memory systems employing those methods, and a computer readable storage medium having computer readable code embodied in it and implementing those methods.

Figure 4:
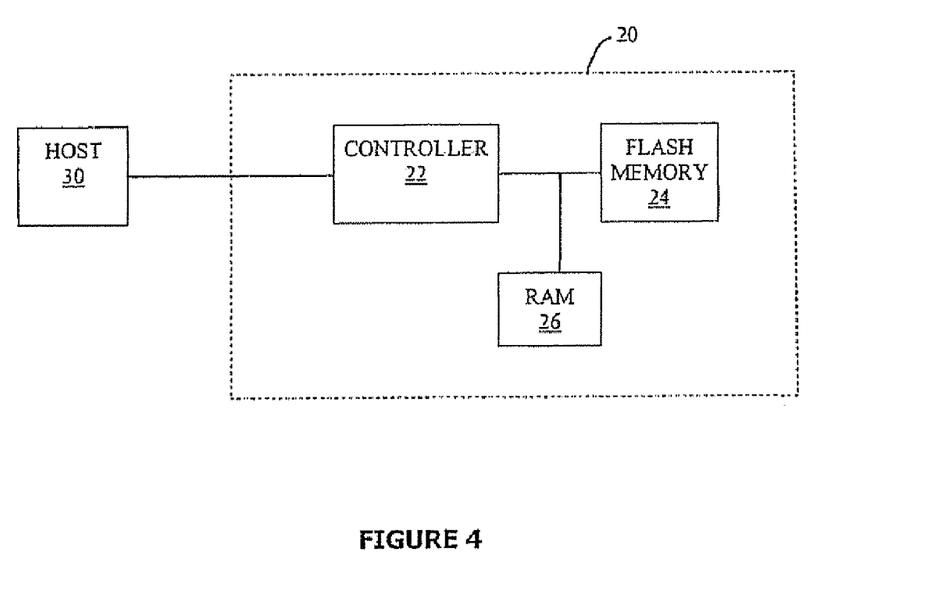
FIG. 4 is a high-level block diagram of a flash memory device of the present invention.

Referring again to the drawings, FIG. 4 is a high-level block diagram of a flash memory device 20 of the present invention, coupled to a host 30. FIG. 4 is adapted from FIG. 1 of Ban, U.S. Pat. No. 5,404,485, which patent is incorporated by reference for all purposes as if fully set forth herein. (Please note that U.S. Pat. No. 5,404,485 uses different terminology than the present disclosure: U.S. Pat. 5,404,485 calls the erase blocks of a flash memory "units".) Flash memory device 20 includes a flash memory 24, a controller 22 and a random access memory (RAM) 26. Controller 22, that corresponds to "flash control 14" of U.S. Pat. No. 5,404,485, manages flash memory 24, with the help of RAM 26, as described in U.S. Pat. No. 5,404,485. Controller 22 also supports wear leveling of the blocks of flash memory 24 using relative grades as described above.

Figure 5:
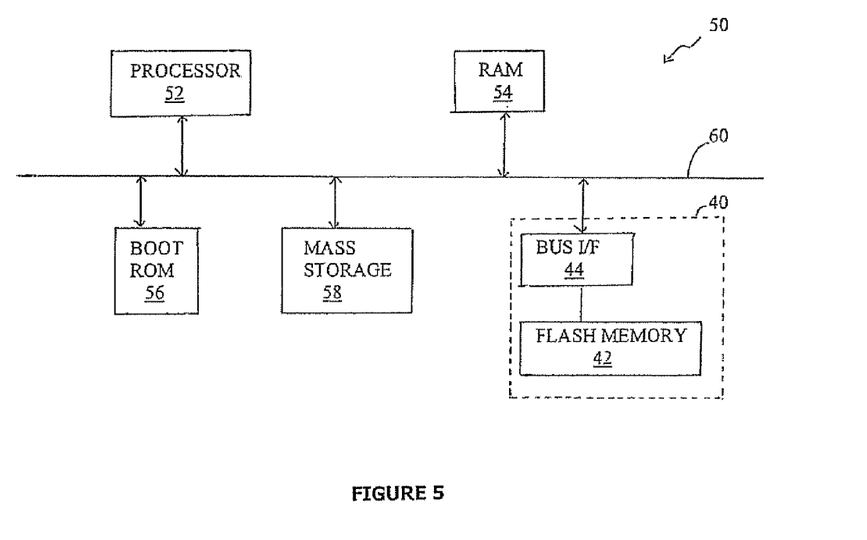
FIG. 5 is a high-level partial block diagram of a data storage system of the present invention.

FIG. 5 is a high-level partial block diagram of an alternative data storage system 50 of the present invention. Data storage system 50 includes a processor 52 and four memory devices: a RAM 54, a boot ROM 56, a mass storage device (hard disk) 58 and a flash memory device 40, all communicating via a common bus 60. Like flash memory device 20, flash memory device 40 includes a flash memory 42. Unlike flash memory device 20, flash memory device 40 lacks its own controller and RAM. Instead, processor 52 emulates controller 22 by executing a software driver that implements the methodology of U.S. Pat. No. 5,404,485 in the manner e.g. of the TrueFFS™ driver of M-Systems Flash Disk Pioneers Ltd. of Kfar Saba, Israel, and that also implements the wear leveling methodology of the present invention. Flash memory device also includes a bus interface 44 to enable processor 52 to communicate with flash memory 42.

The code of the software driver that processor 52 executes to manage flash memory 42 is stored in mass storage device 58 and is transferred to RAM 54 for execution. Mass storage device 58 thus is an example of a computer-readable code storage medium in which is embedded computer readable code for managing flash memory 42 according to the principles of the present invention.

While the invention has been described with respect to a limited number of embodiments, it will be appreciated that many variations, modifications and other applications of the invention may be made.

What is claimed is:

1. A method of managing a memory, of a memory device, that includes a plurality of blocks, the method comprising the steps of, for each block:
   (a) calculating a number that is a function of how many times said each block has been erased and of how many times at least one other block has been erased; and
   (b) storing said number in the memory device;
wherein, for at least two of the blocks, said at least one other block of a first of said at least two blocks is different from said at least one other block of a second of said at least two blocks.

2. The method of claim 1, further comprising the step of, for each block:
   (c) updating said number whenever said each block is erased.

3. The method of claim 1, further comprising the step of, for each block:
   (c) updating said number whenever one of said at least one other block is erased.

4. The method of claim 1, further comprising the step of:
   (c) selecting at least one block to be erased at least in part in accordance with said numbers.

5. The method of claim 1, wherein said storing is effected by steps including, for each of at least one of the blocks, storing said number in said each block.

6. The method of claim 1, wherein said storing is effected by steps including, for each of at least one of the blocks, storing said number outside of said each block.

7. The method of claim 1, wherein, for each block, said function is a relative grade of said each block.

8. The method of claim 7, wherein, for each of at least one of the blocks, said relative grade depends on a difference between an erase count of said each block and an erase count of one other block.

9. The method of claim 7, wherein, for each of at least one of the blocks, said relative grade depends on a difference between an erase count of said each block and an average erase count of at least two other blocks.

10. A memory device comprising:
   (a) a memory that includes a plurality of blocks; and
   (b) a controller for managing said memory by steps including: for each said block:
      (i) calculating a number that is a function of how many times said each block has been erased and of how many times at least one other said block has been erased, and
      (ii) storing said number in the memory device;

wherein, for at least two of the blocks, said at least one other block of a first of said at least two blocks is different from said at least one other block of a second of said at least two blocks.

11. The memory device of claim 10, wherein said memory is a flash memory.

12. A computer-readable storage medium having computer-readable code embodied on said computer-readable storage medium, the computer-readable code for managing a memory, of a memory device, that includes a plurality of blocks, the computer-readable code comprising:
(a) program code for, for each block, calculating a number that is a function of how many times said each block has been erased and of how many times at least one other said block has been erased; and
(b) program code for, for each block, storing said number in the memory device;
wherein, for at least two of the blocks, said at least one other block of a first of said at least two blocks is different from said at least one other block of a second of said at least two blocks.

13. A method of managing a memory, of a memory device, that includes a plurality of blocks, the method comprising the steps of, for each block:
(a) calculating a number that is a function of how many times said each block has been erased and of how many times at least one other block has been erased; and
(b) storing said number in the memory device;
wherein, for each block, said function is a relative grade of said each block; and
wherein, for each of at least one of the blocks, said relative grade depends on a difference between an erase count of said each block and an erase count of a neighbor of said each block.

14. A memory device comprising:
(a) a memory that includes a plurality of blocks; and
(b) a controller for managing said memory by steps including: for each said block:
(i) calculating a number that is a function of how many times said each block has been erased and of how many times at least one other said block has been erased, and
(ii) storing said number in the memory device;
wherein, for each block, said function is a relative grade of said each block; and
wherein, for each of at least one of the blocks, said relative grade depends on a difference between an erase count of said each block and an erase count of a neighbor of said each block.

15. A computer-readable storage medium having computer-readable code embodied on said computer-readable storage medium, the computer-readable code for managing a memory, of a memory device, that includes a plurality of blocks, the computer-readable code comprising:
(a) program code for, for each block, calculating a number that is a function of how many times said each block has been erased and of how many times at least one other said block has been erased; and
(b) program code for, for each block, storing said number in the memory device;
wherein, for each block, said function is a relative grade of said each block; and
wherein, for each of at least one of the blocks, said relative grade depends on a difference between an erase count of said each block and an erase count of a neighbor of said each block.

16. A method of managing a memory, of a memory device, that includes a plurality of blocks, the method comprising the steps of, for each block:
(a) calculating a number that is a function of how many times said each block has been erased and of how many times at least one other block has been erased; and
(b) storing said number in the memory device;
wherein, for each block, said function is a relative grade of said each block; and
wherein, for each of at least one of the blocks, said relative grade depends on a difference between an erase count of said each block and an average erase count of at least two other blocks, one of said two other blocks being a neighbor of said each block.

17. A memory device comprising:
(a) a memory that includes a plurality of blocks; and
(b) a controller for managing said memory by steps including: for each said block:
(i) calculating a number that is a function of how many times said each block has been erased and of how many times at least one other said block has been erased, and
(ii) storing said number in the memory device;
wherein, for each block, said function is a relative grade of said each block; and
wherein, for each of at least one of the blocks, said relative grade depends on a difference between an erase count of said each block and an average erase count of at least two other blocks, one of said two other blocks being a neighbor of said each block.

18. A computer-readable storage medium having computer-readable code embodied on said computer-readable storage medium, the computer-readable code for managing a memory, of a memory device, that includes a plurality of blocks, the computer-readable code comprising:
(a) program code for, for each block, calculating a number that is a function of how many times said each block has been erased and of how many times at least one other said block has been erased; and
(b) program code for, for each block, storing said number in the memory device;
wherein, for each block, said function is a relative grade of said each block; and
wherein, for each of at least one of the blocks, said relative grade depends on a difference between an erase count of said each block and an average erase count of at least two other blocks, one of said two other blocks being a neighbor of said each block.

19. A method of managing a memory, of a memory device, that includes a plurality of blocks, the method comprising the steps of, for each block:
(a) calculating a number that is a function of how many times said each block has been erased and of how many times at least one other block has been erased; and
(b) storing said number in the memory device;
wherein said calculating includes, for each block, truncating said function at a number of bits insufficient to store a maximum allowed number of erase cycles per block.

20. A memory device comprising:
(a) a memory that includes a plurality of blocks; and
(b) a controller for managing said memory by steps including: for each said block:
(i) calculating a number that is a function of how many times said each block has been erased and of how many times at least one other said block has been erased, and
(ii) storing said number in the memory device;

wherein said calculating includes, for each block, truncating said function at a number of bits insufficient to store a maximum allowed number of erase cycles per block.

21. A computer-readable storage medium having computer-readable code embodied on said computer-readable storage medium, the computer-readable code for managing a memory, of a memory device, that includes a plurality of blocks, the computer-readable code comprising:

(a) program code for, for each block, calculating a number that is a function of how many times said each block has been erased and of how many times at least one other said block has been erased; and (b) program code for, for each block, storing said number in the memory device;

wherein said calculating includes, for each block, truncating said function at a number of bits insufficient to store a maximum allowed number of erase cycles per block.

* * * * *